US012747493B2

(12) United States Patent
Kim et al.

(10) Patent No.: US 12,747,493 B2
(45) Date of Patent: Sep. 29, 2026

(54) MAGNETRON SPUTTERING APPARATUS

(71) Applicant: DAEGU GYEONGBUK INSTITUTE OF SCIENCE AND TECHNOLOGY, Daegu (KR)

(72) Inventors: June Seo Kim, Daegu (KR); Joon Woo Kim, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 0 days.

(21) Appl. No.: 19/100,649

(22) PCT Filed: Jun. 23, 2023

(86) PCT No.: PCT/KR2023/008771

§ 371 (c)(1),
(2) Date: Feb. 3, 2025

(87) PCT Pub. No.: WO2024/071578

PCT Pub. Date: Apr. 4, 2024

(65) Prior Publication Data

US 2026/0043127 A1 Feb. 12, 2026

(30) Foreign Application Priority Data

Sep. 27, 2022 (KR) ........................ 10-2022-0122858

(51) Int. Cl.
*C23C 14/54* (2006.01)
*C23C 14/35* (2006.01)
*H01J 37/34* (2006.01)

(52) U.S. Cl.
CPC .............. *C23C 14/54* (2013.01); *C23C 14/35* (2013.01); *H01J 37/3405* (2013.01);
(Continued)

(58) Field of Classification Search
CPC ...... C23C 14/54; C23C 14/35; H01J 37/3405; H01J 37/3452; H01J 2237/002; H01J 2237/332; H01J 37/34; H01J 37/3497
See application file for complete search history.

(56) References Cited

U.S. PATENT DOCUMENTS

2005/0030017 A1* 2/2005 Ito ............................ H01F 6/00 324/248
2012/0048726 A1* 3/2012 Black .................. H01J 37/3435 204/192.13

(Continued)

FOREIGN PATENT DOCUMENTS

IS 2006265681 A * 10/2006
JP 2836876 12/1998

(Continued)

OTHER PUBLICATIONS

JP-2006265681-A Translation (Year: 2006).*

(Continued)

*Primary Examiner* — Patrick S Ott
(74) *Attorney, Agent, or Firm* — LEX IP MEISTER, PLLC

(57) ABSTRACT

A magnetron sputtering apparatus according to an embodiment of the present disclosure includes a chamber accommodating sputter gas and providing an internal space in which a workpiece is arranged, an ion source unit including a sputtering target providing a deposition material to the workpiece by an electric field formed in the internal space and a magnet arranged at one side of the sputtering target to form a magnetic field, a power supply unit providing power to the ion source unit, and a cooling unit including a cooling device provided outside the chamber and a cold head directly connecting the cooling device to the ion source unit
(Continued)

in the internal space, wherein the cold head includes metal, and does not require the introduction of refrigerant.

8 Claims, 10 Drawing Sheets

(52) U.S. Cl.
CPC ..... *H01J 37/3452* (2013.01); *H01J 2237/002* (2013.01); *H01J 2237/332* (2013.01)

(56) References Cited

U.S. PATENT DOCUMENTS

| | | | | |
|---|---|---|---|---|
| 2019/0348251 | A1* | 11/2019 | Monroe | G01L 21/30 |
| 2020/0135434 | A1* | 4/2020 | Nakagawasai | H01J 37/32724 |
| 2021/0079517 | A1* | 3/2021 | Lee | C23C 14/541 |
| 2021/0249295 | A1* | 8/2021 | Takeda | H01J 37/32724 |

FOREIGN PATENT DOCUMENTS

| | | |
|---|---|---|
| JP | 2005-057219 | 3/2005 |
| JP | 2006-265681 | 10/2006 |
| JP | 2020047624 | 3/2020 |
| JP | 2020-066775 | 4/2020 |
| KR | 10-2004-0059866 | 7/2004 |
| KR | 10-0948547 | 3/2010 |
| KR | 10-2021-0032112 | 3/2021 |

OTHER PUBLICATIONS

S Swann, “Magnetron Sputtering”, Physics in Technology, vol. 19, No. 2, 67-75, 1988.
KIPO, Search Report of PCT/KR2023/008771 dated Dec. 28, 2023, total 3 pages.

* cited by examiner

MAGNETRON SPUTTERING APPARATUS

TECHNICAL FIELD

The present disclosure relates to a magnetron sputtering apparatus.

BACKGROUND ART

Sputtering is one of the representative physical vapor deposition (PVD) technologies that utilizes vacuum where plasma can be formed to deposit thin films on substrates used in the manufacture of semiconductors, FPDs (LCD, OLED, etc.) or solar cells.

The efficiency of sputtering apparatuses may vary due to various factors, and among various sputtering apparatuses, there is a magnetron sputtering apparatus that uses magnets to improve efficiency.

The magnetron sputtering apparatus generally includes a chamber and components disposed inside the chamber, including a sputtering target formed of thin film material, a backing plate to which the sputtering target is coupled, and a magnet.

In the magnetron sputtering apparatus, after creating a vacuum inside the chamber, voltage is applied to the backing plate while introducing sputter gas such as argon gas into the chamber. Then, particles of the sputter gas are ionized into plasma, and the ionized sputter gas particles collide with the sputtering target, whereupon kinetic energy possessed by the ionized sputter gas particles is transferred to atoms constituting the sputtering target, thereby enabling formation of a sputtering reaction in which atoms constituting the sputtering target are ejected from the sputtering target.

The atoms ejected from the sputtering target diffuse toward the substrate and deposit on the substrate to form a thin film on the substrate. In this regard, due to the influence of the magnetic field by the magnet positioned on the back side of the sputtering target, the ionization probability of particles being ionized is increased, thereby causing the sputtering phenomenon to occur rapidly.

The sputtering reaction may form a thin film on a substrate through reactive sputtering phenomena by introducing reactive gases such as O, $N_2$, $N_2O$ along with the sputter gas, wherein the reactive sputtering introduces reactive gas into the chamber interior and reacts the same with atoms ejected from the target to produce a film that is either directly sputtered onto the substrate or reacted again with free target material and then sputtered onto the substrate.

In the magnetron sputtering apparatus, NdFeB material permanent magnets may be used as the magnet, but such permanent magnets experience rapid decrease in magnetic field strength with increasing temperature. Therefore, the magnetron sputtering apparatus experiences the deterioration of the apparatus's performance due to heating caused by plasma generation and deterioration of the magnet.

Additionally, deformation of the backing plate between the sputtering target and magnet may occur due to heating, decreased utilization of the sputtering target may occur due to localized erosion in certain regions of the sputtering target, or there is a limitation on the utilization of magnet body target thickness where only thin magnet body targets should be used due to magnetic field interference between magnet body targets and magnetics NdFeB magnets preventing plasma formation. Furthermore, when introducing liquefied gas to maintain cryogenic cooling temperatures, coolant consumption and loss amounts vary depending on the liquefied gas tube connection area and liquefied gas transfer pipe length.

While this may be addressed by including a water-cooling type cooling device to cool the magnetron sputtering apparatus, water-cooling methods have limitations in cooling performance, and as operation of the magnetron sputtering apparatus becomes more active, cooling performance tends to deteriorate, and furthermore, when the sputtering operation rate increases, water leakage and magnet oxidation caused by deformation of the cooling device due to overheating of the apparatus may occur, along with constraints on magnet body target thickness and coolant consumption and loss amounts depending on cooling system structure.

DISCLOSURE

Technical Problem

The present disclosure provides an integrated cooling system through coupling of a pulse tube refrigerator that enables effective cooling to improve the performance of a magnetron sputtering apparatus. However, this objective is an example only and the scope of the present disclosure is not limited thereby.

Technical Solution

As a means for achieving the technical solution, a magnetron sputtering apparatus according to an embodiment of the present disclosure includes a chamber accommodating sputter gas and providing an internal space in which a workpiece is arranged, an ion source unit including a sputtering target providing a deposition material to the workpiece by an electric field formed in the internal space and a magnet arranged at one side of the sputtering target to form a magnetic field, a power supply unit providing power to the ion source unit, and a cooling unit including a cooling device provided outside the chamber and a cold head directly connecting the cooling device to the ion source unit in the internal space, wherein the cold head includes metal.

Advantageous Effects

According to the present disclosure, a cooling performance can be improved through an integrated cooling system that does not require a refrigerant for a magnetron sputtering apparatus, thereby improving the performance and efficiency of a magnetron sputtering apparatus.

The scope of the present disclosure is not limited by these effects.

BEST MODE

Figure 1:
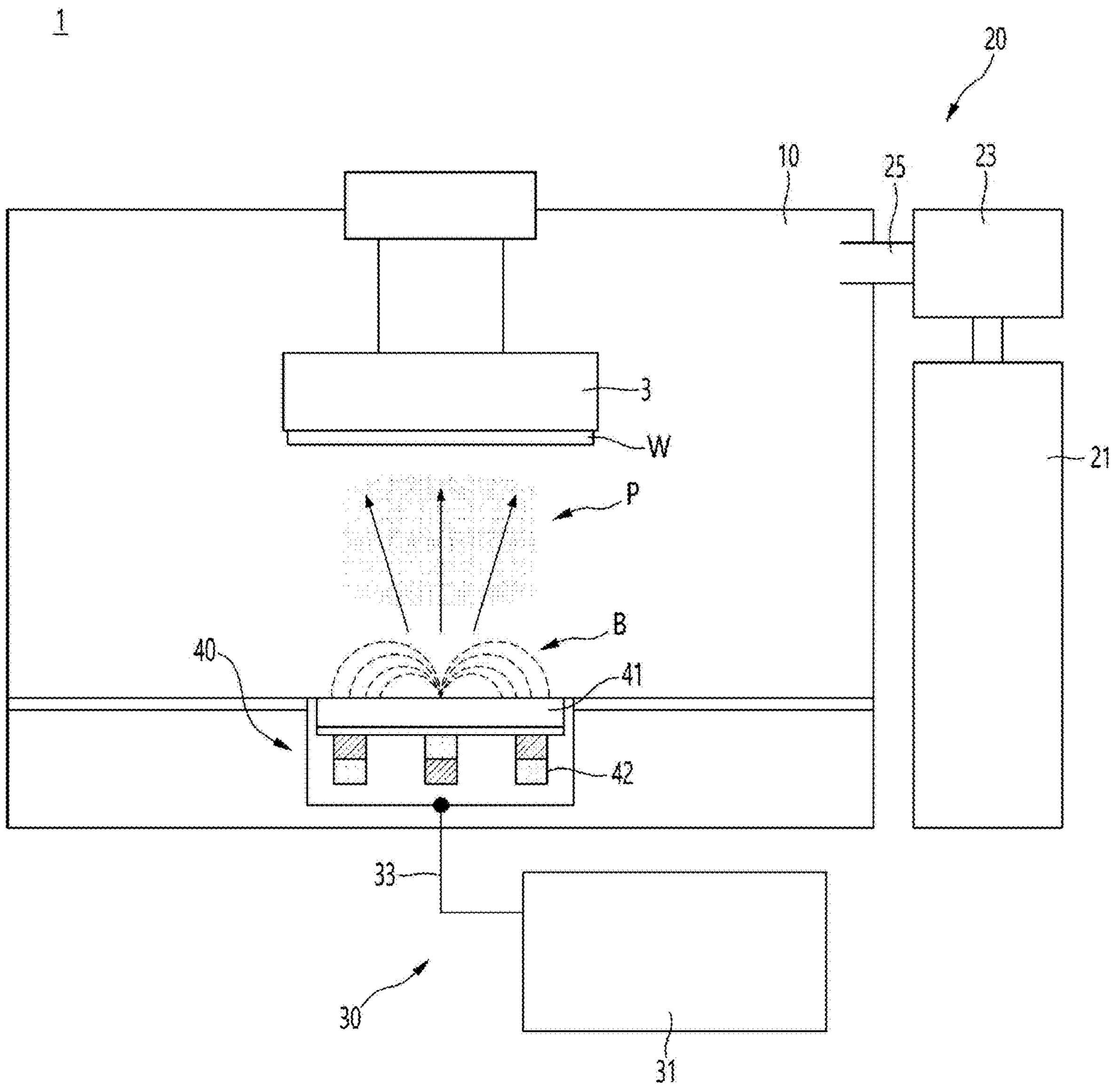
FIG. 1 is a drawing illustrating a magnetron sputtering apparatus according to an embodiment of the present disclosure.

As a means for achieving the technical solution, a magnetron sputtering apparatus according to an embodiment of the present disclosure includes a chamber accommodating sputter gas and providing an internal space in which a workpiece is arranged, an ion source unit including a sputtering target providing a deposition material to the workpiece by an electric field formed in the internal space and a magnet arranged at one side of the sputtering target to form a magnetic field, a power supply unit providing power to the ion source unit, and a cooling unit including a cooling device provided outside the chamber and a cold head directly connecting the cooling device to the ion source unit in the internal space, wherein the cold head includes metal.

In an embodiment, the cold head may be surrounded by a vacuum layer.

In an embodiment, the cold head may directly connect the ion source unit and the cooling device to each other to maintain the magnet at −270 to 20° C. by using thermal conduction.

In an embodiment, the cooling device may be provided on the chamber via a connecting portion, in which the connecting portion may include a vibration-proof part and a coupling part formed at opposite ends of the vibration-proof part, and the vibration-proof part may include a metal bellows surrounding the cold head.

In an embodiment, the cooling device may be provided as a pulse tube refrigerator and formed integrally with the chamber.

In an embodiment, the magnet may include a first magnet and a second magnet arranged with different polarities with respect to the sputtering target.

In an embodiment, the ion source unit may include a frame on which the sputtering target and the magnet are provided, a plurality of cores are inserted in a male screw shape into one side of the frame, and the cold head may be in surface contact with the plurality of cores exposed to one side of the frame.

In an embodiment, the ion source unit includes a frame in which the sputtering target and the magnet are provided, a core, and a plurality of disks having an inner surface in contact with an outer surface of the core and spaced apart along an extension direction of the core are inserted into the frame, and the cold head may be in surface contact with the core exposed to one side of the frame.

In an embodiment, the ion source unit includes a frame in which the sputtering target and the magnet are provided, one side surface of the frame is formed to have a recess part and a protrusion part, and an end of the cold head is formed in a shape complementary to the one side of the frame and may be coupled with the one side of the frame.

In an embodiment, a control unit for controlling the cooling unit and the power supply unit, and a sensing unit capable of measuring the temperature of the ion source unit may be further included.

Other aspects, features and advantages other than those described above will become apparent from the following drawings, claims and detailed description of the disclosure.

Mode for Invention

The present disclosure may be variously modified and may have various embodiments, and specific embodiments will be illustrated in the drawings and described in detail in the detailed description. The effects and features of the present disclosure and methods for achieving them will become apparent with reference to the embodiments described later in detail along with the drawings. However, the present disclosure is not limited to the embodiments disclosed below but may be implemented in various forms.

Hereinafter, embodiments of the present disclosure will be described in detail with reference to the accompanying drawings, and when explaining with reference to the drawings, the same or corresponding components will be given the same reference numerals and redundant descriptions thereof will be omitted.

In the following embodiments, the terms "first," "second," etc. are used for the purpose of distinguishing one component from another component rather than having a limiting meaning.

In the following embodiments, singular expressions include plural expressions unless the context clearly dictates otherwise.

In the following embodiments, terms such as "include" or "have" mean that features or components described in the specification exist and do not preclude the possibility of addition of one or more other features or components.

For convenience of description, components in the drawings may be exaggerated or reduced in size. For example, the size and thickness of each configuration shown in the drawings are arbitrarily shown for convenience of description. Accordingly, the following embodiments are not necessarily limited to what is shown.

In the following embodiments, when regions or components are described as being connected, this includes not only cases where regions or components are directly connected but also cases where regions or components are indirectly connected with other regions or components interposed therebetween.

Figure 2:
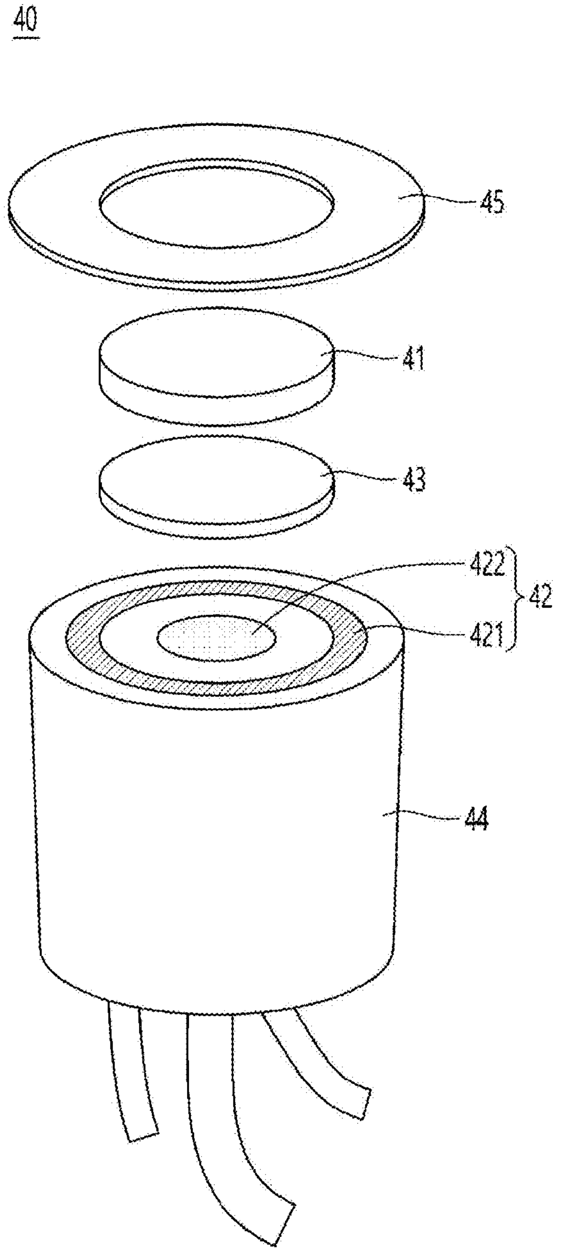
FIG. 2 is an exploded perspective view of an ion source unit of FIG. 1.
Figure 3:
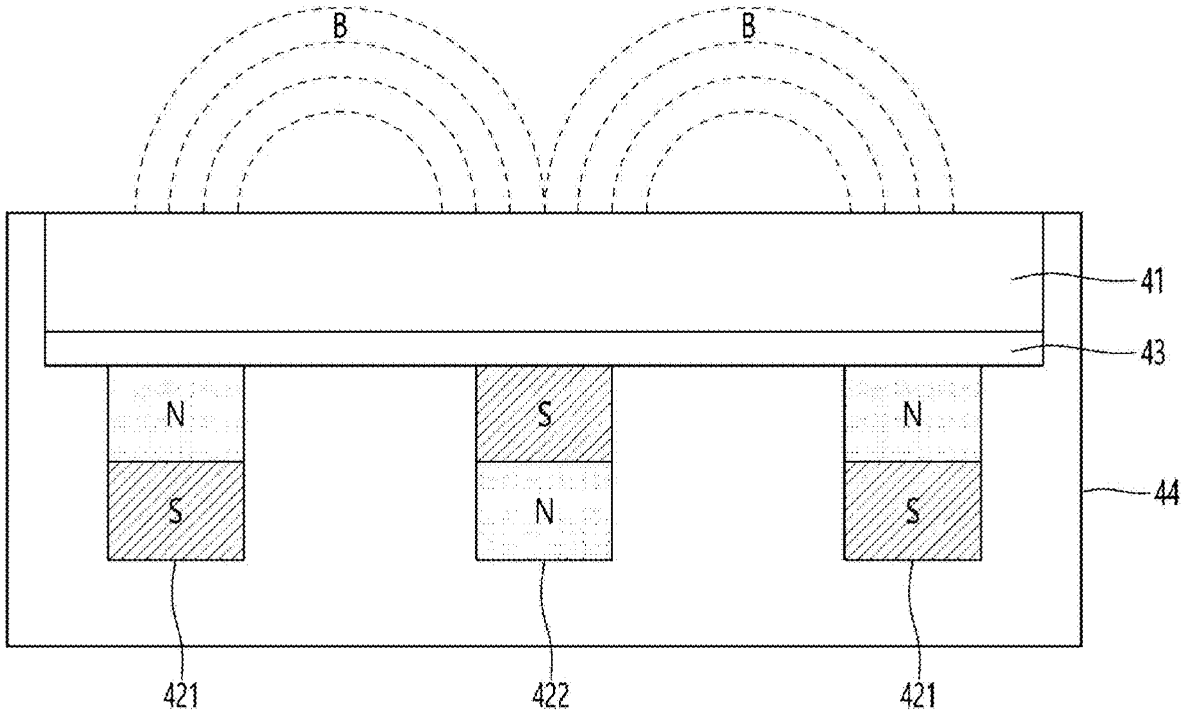
FIG. 3 is a cross-sectional view of a part of the configuration of the ion source unit of FIG. 2.

FIG. 1 is a view illustrating a magnetron sputtering apparatus 1 according to an embodiment of the present disclosure, FIG. 2 is an exploded perspective view of an ion source unit 40 of FIG. 1, and FIG. 3 is a cross-sectional view of a part of the configuration of the ion source unit 40 of FIG. 2.

Referring to FIG. 1, a magnetron sputtering apparatus 1 may include a chamber 10, a gas supply unit 20, a power supply unit 30, and an ion source unit 40.

The chamber 10 has an internal space sealed from the outside, and sputter gas may be accommodated in the internal space and a workpiece W may be placed therein such that a deposition process of the workpiece W may be performed. The workpiece W may be, for example, a substrate used in the manufacture of semiconductors, FPDs, or solar cells.

The chamber 10 may have an internal space formed into a vacuum state by a vacuum pump. The workpiece W and a holder 3 supporting the workpiece W may be provided in the internal space of the chamber.

The ion source unit 40 may be positioned opposite to the workpiece W in the internal space of the chamber. A thin film may be deposited on the workpiece W by plasma P formed between the workpiece W and the ion source unit 40 in the internal space of the chamber. The plasma P may be formed as particles of sputter gas provided in the internal space of the chamber become ionized.

The gas supply unit 20 may supply sputter gas to the internal space of the chamber, including a gas supply device 21, a mass flow meter 23, and a gas supply pipe 25. In an embodiment, sputter gas may be provided into the chamber 10 through the gas supply pipe 25 by being connected to the mass flow meter 23 and/or gas supply device 21. The sputter gas may be, for example, argon (Ar) gas. However, the sputter gas is not limited to argon gas, and may be replaced with an inert gas such as neon (Ne) gas or a gas having properties similar to an inert gas such as nitrogen (N) gas.

The gas supply unit 20 may provide sputter gas and reaction gas to the internal space of the chamber. The reaction gas may be a gas containing, for example, O, $N_2$, $N_2O$, etc. The reaction gas may form a thin film on the workpiece W by directly releasing atoms in the internal space of the chamber.

Referring to FIG. 1, the gas supply pipe 25 is illustrated as being connected to one side of the chamber 10, but is not limited thereto and may be positioned adjacent to the ion source unit 40 to directly supply argon gas to a sputtering target 41.

The mass flow meter 23, namely mass flow controller (MFC), is a device that accurately measures and controls the amount of gas provided from the gas supply device 21 into the chamber 10. The mass flow meter 23 may be provided as multiples depending on the type of gas or sputtering target 41.

The power supply unit 30 includes a power supply device 31 and a power cable 33, and supplies power to the ion source unit 40 to ionize sputter gas provided into the internal space of the chamber.

The power supply unit 30 may provide current, for example, direct current, to the ion source unit 40 to form an electric field in the internal space of the chamber. The particles of the sputter gas contained in the internal space of the chamber may be ionized into plasma form by the electric field formed in the internal space of the chamber.

The ion source unit 40 may be positioned opposite to the workpiece W and may provide atoms to be deposited onto the workpiece W.

Referring to FIGS. 2 and 3, the ion source unit 40 may include the sputtering target 41, a magnet 42, a backing plate 43, a frame 44, and a shield 45.

The sputtering target 41 may be prepared in accordance with the composition of a thin film to be deposited on the workpiece W, such as Al, Mo, Ti, Cu or ITO, and may be manufactured with high purity to be used as a material for sputtering. In an embodiment, the sputtering target 41 may be manufactured in the form of a flat plate having a certain thickness by powder metallurgy.

The sputtering target 41 may provide a deposition material to the workpiece W by a magnetic field formed in the internal space of the chamber.

The magnet 42 may be placed on one side of the sputtering target 41 to form a magnetic field B. In an embodiment, the magnet 42 may be positioned to face the workpiece W with the sputtering target 41 therebetween.

The magnet 42 may be provided in multiple pieces. In an embodiment, the magnet 42 may include a first magnet 421 and a second magnet 422 arranged with different polarities with respect to the sputtering target 41. For example, the first magnet 421 may be arranged to have an N pole toward the sputtering target 41, and the second magnet 422 may be arranged to have an S pole toward the sputtering target 41.

In an embodiment, referring to FIG. 2, a first magnet body is formed in a cylindrical shape with an open central region and a cross-section that is circular, and a second magnet body may be inserted and placed in the central region of the first magnet body while being spaced apart from the inner surface of the first magnet body.

Referring to FIG. 3, a plurality of magnets 42 may be arranged on one side (lower side) of the sputtering target 41 with alternating N poles and S poles with respect to the sputtering target 41, and a magnetic field B having a tunnel-shaped magnetic flux in a closed loop may be formed on another side (upper side) of the sputtering target 41. The ionized electrons on the other side (upper side) of the sputtering target 41 and secondary electrons generated by sputtering may be captured by the magnetic field B, whereby the plasma density may be increased and the sputtering rate may be improved.

The backing plate 43 may be placed between the sputtering target 41 and the magnet 42. Because the temperature of the internal space of the chamber may fluctuate between room temperature and approximately 150° C. during the sputtering process, the backing plate 43 may be selected from metal materials having excellent thermal conductivity as a component that may minimize deformation of the sputtering target 41 during rapid cooling and heating of the sputtering target 41. In an embodiment, the backing plate 43 may be provided as a Cu plate. The backing plate 43 may be bonded to one side of a sputtering target 41.

Power may be applied to the backing plate 43 from the power supply unit 30 and the applied power may be transmitted to the sputtering target 41. The sputtering target 41 may form plasma by an applied power to deposit a deposition material on the workpiece W.

The frame 44 may constitute the exterior of the ion source unit 40, provide a space in which the sputtering target 41, the magnet 42, and the backing plate 43 are provided, and include a material having excellent thermal conductivity, for example, a material including Cu, to allow heat generated in the space to be released.

The inner edge of the frame 44 may be filled with a filler, and as the filler, high-pressure glass fiber, expanded polystyrene, and plastic with low thermal conductivity may be used to improve the insulation performance of the ion source unit 40. The frame 44 may be cooled to a low temperature by a cooling unit described below, and the filler may help maintain the inside of the frame 44 at a low temperature.

The shield 45 may be placed on the other side of the sputtering target 41. In an embodiment, the shield 45 may surround the outside of the sputtering target 41 in an annular shape. The shield 45 may be positioned so as not to be electrically connected to the backing plate 43 and the sputtering target 41.

The shield 45 may act as an anode and may form an electric field with the sputtering target 41 acting as a cathode. The electric field formed between the shield 45 and the sputtering target 41 may cause the sputter gas to be excited to form plasma.

Figure 4:
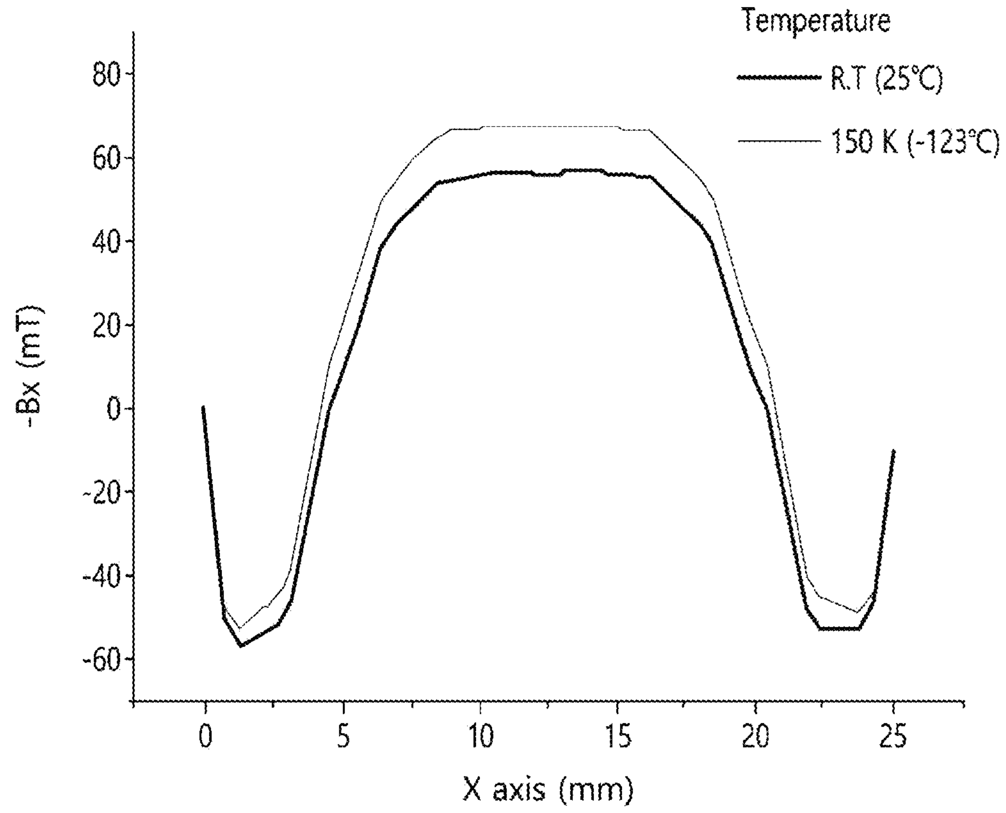
FIG. 4 is a graph showing simulation data values depicting magnetic field strength by the magnet according to temperature changes of the magnetron sputtering apparatus of FIG. 1.

FIG. 4 is a graph showing simulation data values depicting magnetic field strength by the magnet 42 according to temperature changes of the magnetron sputtering apparatus 1 of FIG. 1.

Referring to FIG. 4, the graph shows the magnetic field strength formed on the other side of the sputtering target when the temperature of the sputtering target 41 is at room temperature (R.T, 25° C.) and a cryogenic temperature state (150 K, −123° C.).

The X-axis may be the position set with the center of the upper surface of the sputtering target 41 as 0 mm reference, where the first magnet 421 may be positioned between 0 mm and 5 mm, and the second magnet 422 may be positioned between 20 mm and 25 mm. The Y-axis may show the magnetic field strength corresponding to each position on the other side of the sputtering target 41.

It can be seen that the magnetic field strength may be increased by about 20% at low temperature compared to room temperature on the other side of the sputtering target 41.

When the temperature of the ion source unit 40 is maintained at a low temperature, the strength of the magnetic field formed in the internal space of the chamber increases, and the driving efficiency of the magnetron sputtering apparatus 1, the speed of thin film formation, and the quality of the thin film may be increased, and deterioration of the backing plate 43 and/or the sputtering target 41 may be prevented and the usability may be increased.

Accordingly, a cooling unit may be provided to maintain the ion source unit 40 at a low temperature.

Figure 5:
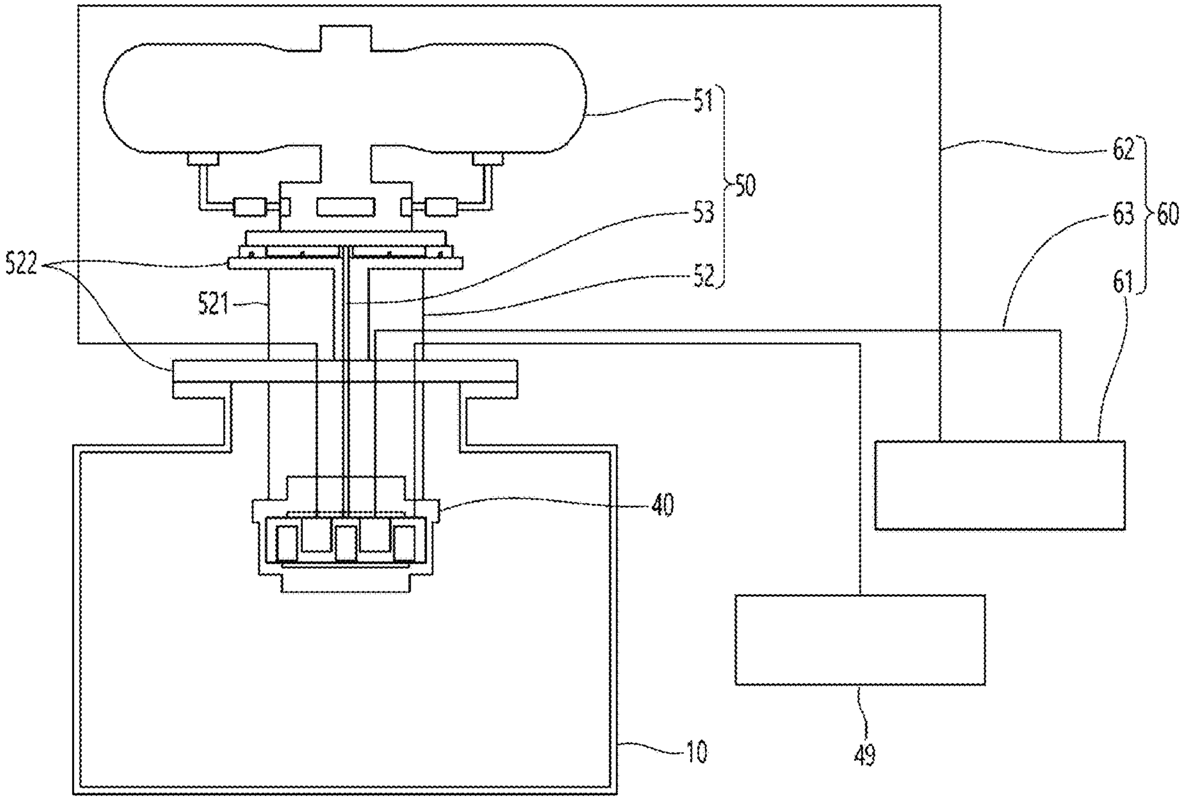
FIG. 5 is a view illustrating a state in which a cooling unit is provided on a chamber of FIG. 1.

FIG. 5 is a view illustrating a state in which a cooling unit is provided on a chamber 10 of FIG. 1. The magnetron sputtering apparatus 1 may include a cooling unit, a sensing unit 49, and a control unit not shown, and may control the temperature of the internal space of the chamber, for example, the temperature of the ion source unit 40.

Referring to FIG. 5, the sensing unit 49 may be provided to measure the temperature of the ion source unit 40. In an embodiment, the sensing unit 49 may detect the temperature of the ion source unit 40 through a cable connected to the ion source unit 40 outside the chamber 10. For example, the sensing unit 49 may detect the temperature of the magnets 421 and 422 through the frame 44.

The control unit may control the power supply unit 30 and the cooling unit based on the temperature of the ion source unit 40 detected by the sensing unit 49.

The cooling unit may be provided to cool the ion source unit 40 and may include a first cooling unit 50 and a second cooling unit 60.

The first cooling unit 50 may include a first cooling device 51, a connecting portion 52, and a cold head 53.

In an embodiment, the first cooling device 51 may be provided as a pulse tube refrigerator. A pulse tube refrigerator may include a compressor, a regenerator, a pulse tube, and suction (high pressure) and exhaust (low pressure) valves, and may operate on the principle of filling the working fluid refrigerant gas into a pulse tube or expanding and discharging the same to the outside from the pulse tube to generate low-temperature refrigerant gas by controlling the opening and closing of the valves.

The first cooling device 51 may be provided on one side outside the chamber 10 via the connecting portion 52. The first cooling device 51 may be formed integrally with the chamber 10.

The connecting portion 52 may be provided to form a stable connection between the first cooling device 51 and the chamber 10, while preventing vibrations generated in the first cooling device 51 from being transmitted to the chamber 10.

In an embodiment, the connecting portion 52 may include a vibration-proof part 521 and a coupling part 522 formed at opposite ends of the vibration-proof part 521.

The vibration-proof part 521 may have a structure capable of preventing vibration generated in the first cooling device 51 from being transmitted to the chamber 10. For example, the vibration-proof part 521 may include a metal bellows surrounding the cold head 53. The inside of the bellows may be filled with a filler to prevent heat loss of the cold head 53. The filler may include high-pressure glass fiber, expanded polystyrene and plastics with low thermal conductivity. In addition, the vibration-proof part 521 may further include a vibration-proof pad surrounding the outside of the bellows. The vibration-proof pad may absorb vibrations generated from the first cooling device 51 together with the bellows, and may also improve the durability and insulation effect of the metal bellows.

The coupling part 522 may have a structure that enables stable bonding between the first cooling device 51 and the chamber 10. For example, the coupling part 522 may be provided in a flange form extending in a direction crossing the extension direction of the vibration-proof part 521 at opposite ends of the vibration-proof part 521. The coupling part 522 may be connected to each of the first cooling device 51 and the chamber 10. In some embodiments, connecting parts such as bolts and nuts may be used.

The first cooling unit 50 may be connected to the ion source unit 40 through the cold head 53 and may cool the ion source unit 40 without a refrigerant. This indicates that refrigerant flowing between the first cooling unit 50 and the ion source unit 40 may not be required by directly connecting the cold head 53 with the first cooling device 51, provided as a pulse tube refrigerator, and the ion source unit 40. In an embodiment, the cold head 53 may be directly connected from the first cooling device 51 provided outside the chamber 10 to the ion source unit 40 in the internal space of the chamber to transfer heat generated from the ion source unit 40 to the first cooling unit 50 by thermal conduction, so that the ion source unit 40 or the magnet 42 may be maintained at a low temperature state, for example, −270° C. to 20° C.

The cold head 53 may be manufactured from a material with excellent thermal conductivity. In an embodiment, the cold head 53 may include a metal material, such as a metal material including copper. The cold head 53 may extend from the first cooling device 51 provided outside the chamber 10 to the ion source unit 40 provided in the internal space of the chamber, and a vacuum layer surrounding the cold head 53 may be formed.

Figure 6:
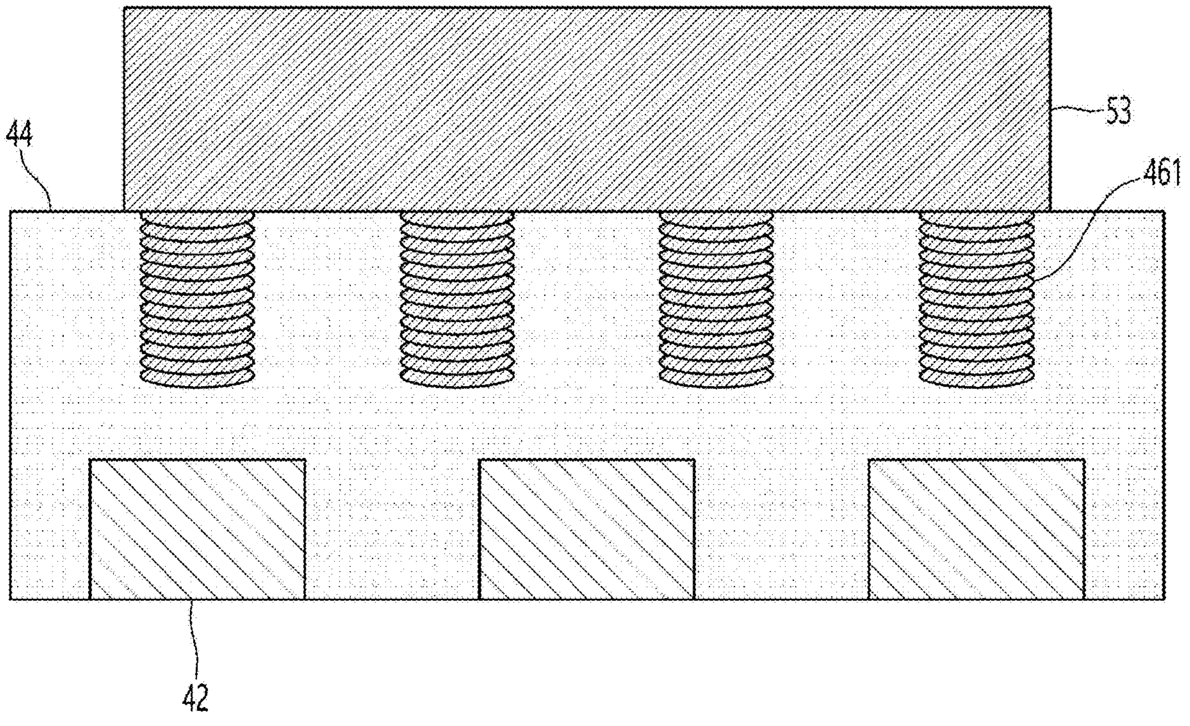
FIG. 6 is a view illustrating a connection portion of the ion source unit and a first cooling unit in FIG. 5.
Figure 7:
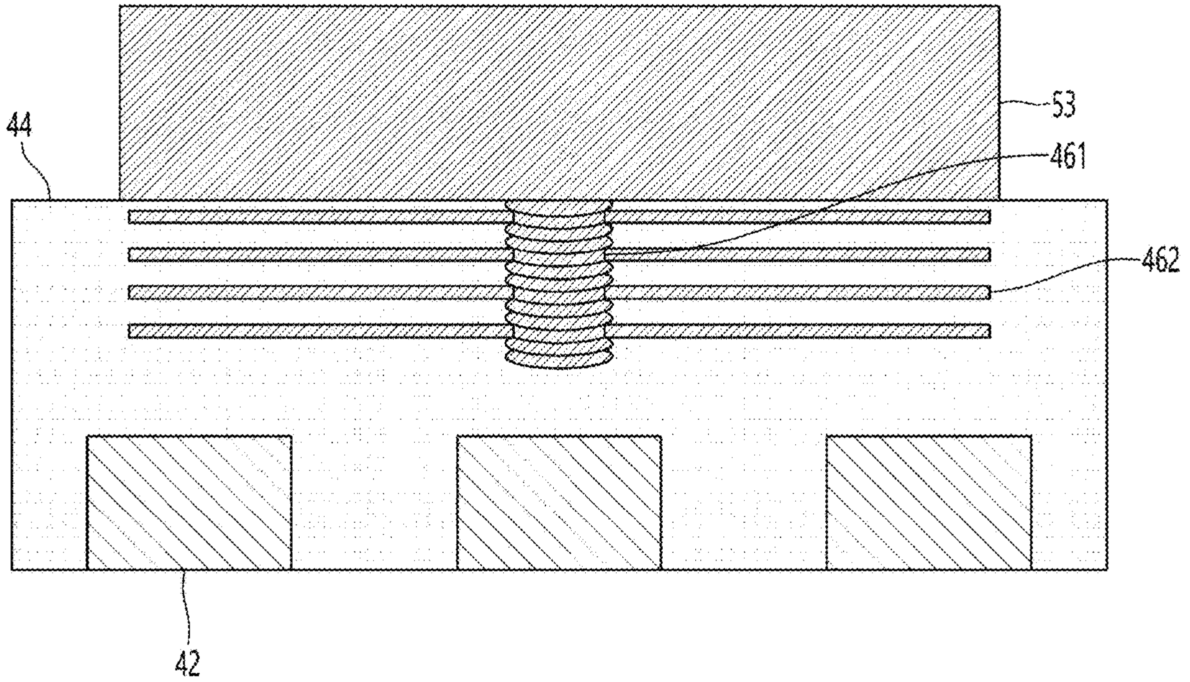
FIG. 7 is a view illustrating a connection portion of an ion source unit and a first cooling unit of an embodiment which is different from FIG. 6.
Figure 8:
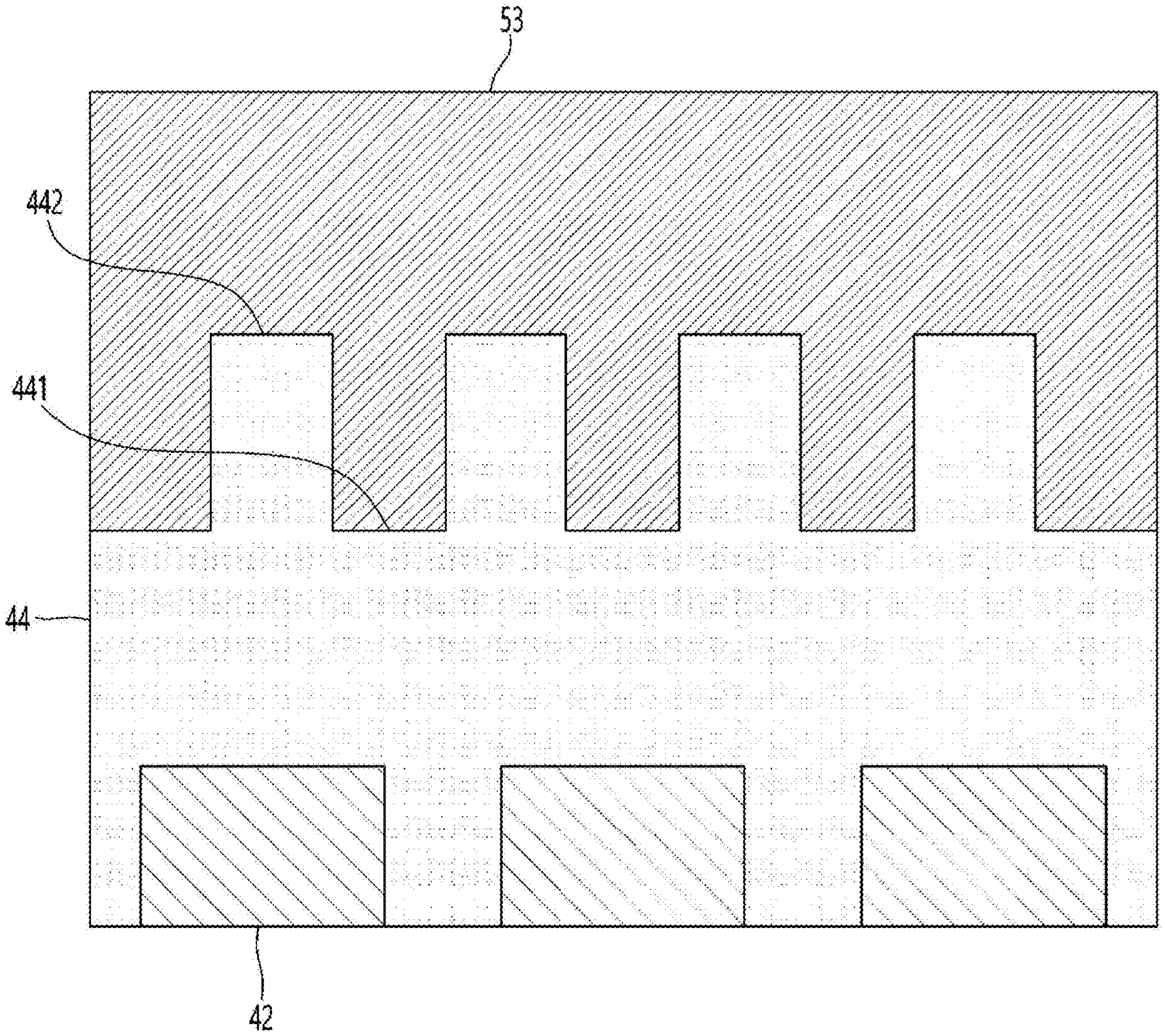
FIG. 8 is a view illustrating a connection portion of an ion source unit and a first cooling unit of an embodiment which is different from FIG. 6.

FIG. 6 is a view illustrating a connection portion between the ion source unit 40 and the first cooling unit in FIG. 5, FIG. 7 is a view illustrating a connection portion between the ion source unit 40 and the first cooling unit in an embodiment which is different from the embodiment illustrated in FIG. 6, and FIG. 8 is a view illustrating a connection portion between the ion source unit 40 and the first cooling unit in an embodiment which is different from the embodiment illustrated in FIG. 6.

In an embodiment, referring to FIG. 6, the cold head 53 may be coupled to the frame 44 and may be in surface contact with one side surface of the frame 44. In this regard, a plurality of cores 461 inserted into the frame 44 are provided on one side of the frame 44, and the cold head 53 may make surface contact with the cores 461 exposed on one side surface of the frame 44.

The cores 461 may include a material with excellent thermal conductivity to improve the conduction of heat generated from the ion source side. In an embodiment, the cores 461 may include a metal material, such as a metal material including copper.

The cores 461 may be arranged at certain intervals on one side surface of the frame 44 to have a certain pattern.

The cores 461 may be inserted to a certain depth in the thickness direction of the frame 44. For example, the cores 461 may be manufactured together with the frame 44 while being inserted into the frame 44 when the frame 44 is manufactured. Alternatively, the cores 461 may be inserted into a hole formed in the frame 44 when the cold head 53 is coupled to the frame 44. In some embodiments, the cores 461 may be provided in the form of a male screw that may be screw-coupled to the hole formed in the frame 44.

In another embodiment, referring to FIG. 7, the cold head 53 may be in surface contact with one side surface of the frame 44 and may also be in surface contact with the cores 461 exposed to one side surface of the frame 44. In some embodiments, the cores 461 may be insertion-provided in the frame 44, together with a plurality of disks 462 having inner circumferential surfaces contacting the outer circumferential surface of the cores 461 and arranged spaced apart along the extension direction of the cores 461.

The cores 461 may pass through the inner circumferential surfaces of the disks 462 and extend to a certain depth in the thickness direction of the frame 44. For example, the cores 461 may be manufactured together with the frame 44 while being inserted in the frame 44 along with the disks 462. Alternatively, when the cold head 53 is coupled to the frame 44, the cores 461 may be inserted through a hole formed as a path passing through the outer circumferential surface of the disks 462 formed in the frame 44. In some embodiments, the cores 461 may be provided in a male screw form that may be screw-coupled to the hole formed in the frame 44.

The cores 461 may be provided as one at the center portion with respect to one side surface of the frame 44. However, the cores 461 may be provided to be arranged in a regular pattern spaced apart at certain intervals on one side surface of the frame 44. In some embodiments, the outer circumferential surface of each of the cores 461 may penetrate the disks 462 in the thickness direction thereof and may make surface contact with the disks 462.

As another embodiment, referring to FIG. 8, one side surface of the frame 44 may be formed to have a recess part 441 and a protrusion part 442. The protrusion part may be a portion protruding compared to the recess part, where a step may be formed between the recess part and the protrusion part.

The cold head 53 may be coupled with one side surface of the frame 44 by having an end portion thereof contacting one side surface of the frame 44 formed in a complementary shape to one side surface of the frame 44 having the recess part and the protrusion part. For example, in a state where the end portion of the cold head 53 contacts one side surface of the frame 44, the protrusion part formed at the end portion of the cold head 53 may be inserted into the recess part formed on one side surface of the frame 44, and the protrusion part formed on one side surface of the frame 44 may be coupled in a state inserted into the recess part formed at the end portion of the cold head 53.

The connection structure of the ion source unit 40 and the first cooling unit illustrated in FIGS. 6 to 8 may enhance the heat transfer from the ion source unit 40 to the first cooling unit.

Meanwhile, the second cooling unit 60 may be provided together with the first cooling unit 50 or separately from the first cooling unit 50.

Referring to FIG. 5, the second cooling unit 60 may include a second cooling device 61, a refrigerant supply pipe 62, and a refrigerant recovery pipe 63.

The second cooling device 61 may include a compressor and a pump. The second cooling device 61 may cool a refrigerant by using a compressor, and the cooled refrigerant may flow toward the ion source unit 40 through the refrigerant supply pipe 62 by using a pump. The refrigerant circulated and discharged from the ion source unit 40 may flow to the second cooling device 61 through the refrigerant recovery pipe 63. In some embodiments, the refrigerant may be provided as a liquefied gas such as liquid nitrogen, liquid helium or liquid hydrogen.

Figure 9:
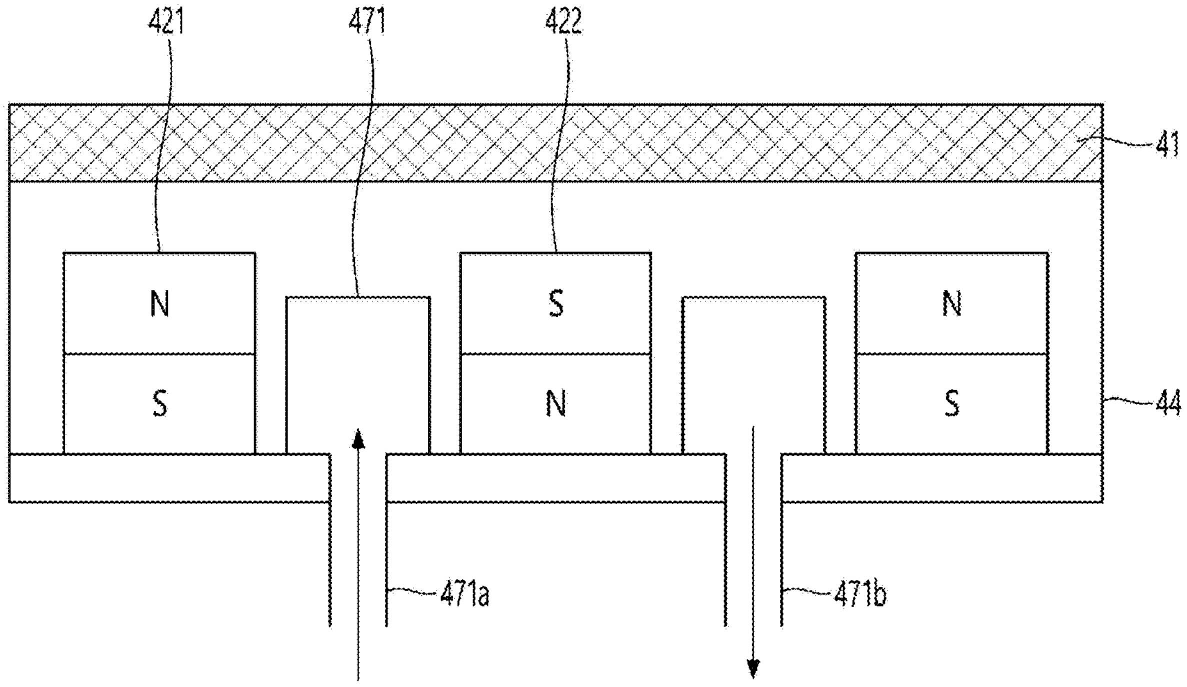
FIG. 9 is a view illustrating a connection portion of the ion source unit and a second cooling unit in FIG. 5.
Figure 10:
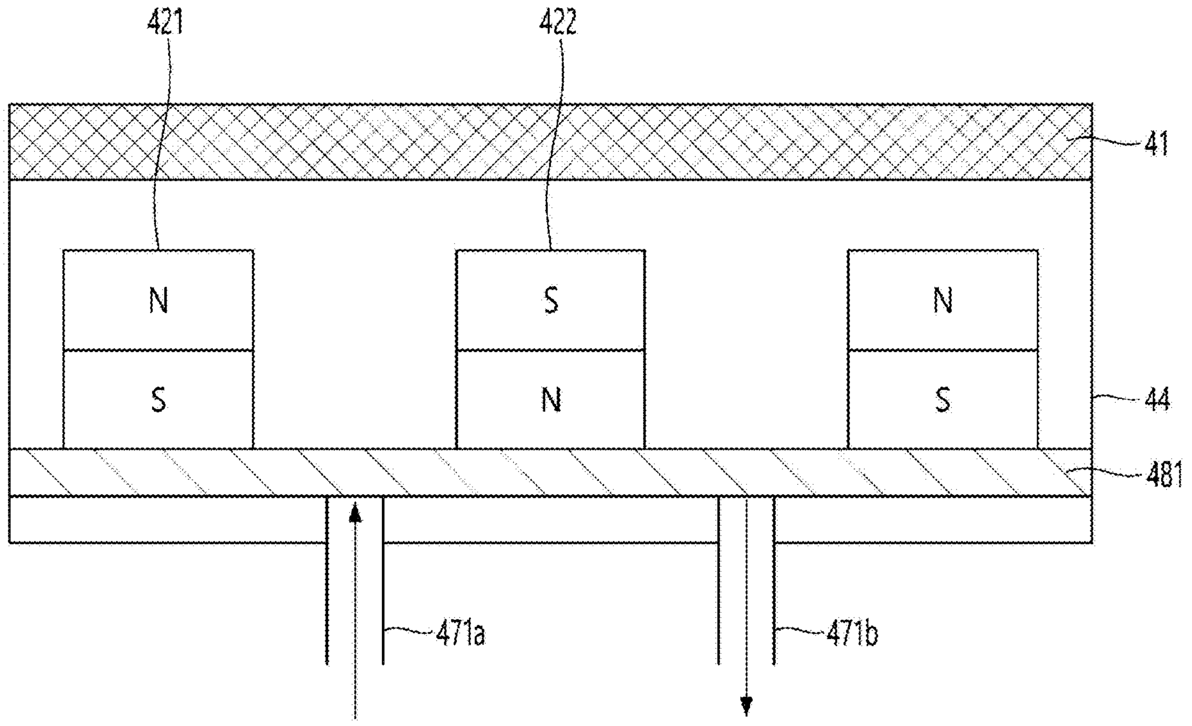
FIG. 10 is a view illustrating a connection portion of an ion source unit and a second cooling unit of an embodiment which is different from FIG. 9.

FIG. 9 is a view illustrating a connection portion between the ion source unit 40 and the second cooling unit 60 in FIG. 5, and FIG. 10 is a view illustrating a connection portion between the ion source unit 40 and the second cooling unit 60 in an embodiment which is different from the embodiment illustrated in FIG. 9.

In some embodiments, referring to FIG. 9, the frame 44 may be provided with a circulation path 471, and an inlet pipe 471*a* and an outlet pipe 471*b* communicating with the circulation path 471.

The circulation path 471 may be arranged spaced apart from the first magnet 421 and the second magnet 422 inside the frame 44, to circulate a refrigerant capable of cooling the sputtering target 41, the first magnet 421, the second magnet 422, the backing plate 43, and the frame 44.

The circulation path 471 may be arranged adjacent to the heat source of the ion source unit 40 to cool the magnets 42 provided as multiples inside the frame 44.

The circulation path 471 may be connected to the inlet pipe 471*a* and the outlet pipe 471*b*. Refrigerant supplied through the refrigerant supply pipe 62 from the outside of the chamber 10 may be introduced into the circulation path 471 through the inlet pipe 471*a*. The refrigerant introduced into the inlet pipe 471*a* may flow along the circulation path 471 and then be discharged through the outlet pipe 471*b*. The refrigerant may circulate inside the second cooling device 61 and the ion source unit 40 and may transfer heat generated in the ion source unit to the second cooling device 61.

The inlet pipe 471*a*, the outlet pipe 471*b*, the refrigerant supply pipe 62, and the refrigerant recovery pipe 63 may have their interiors maintained in a vacuum state to minimize heat exchange between the refrigerant flowing inside the pipes and remaining air inside the pipes or the exterior. In some embodiments, these may include insulating materials, and may have a vacuum layer formed outside.

As another embodiment, referring to FIG. 10, the frame 44 may further be provided with a cooling plate 481.

The cooling plate 481 may be spaced apart from the first magnet 421 and the second magnet 422 inside the frame 44. The cooling plate 481 exchanges heat with the refrigerant circulating inside the frame 44 and may cool the ion source unit 40. In an embodiment, the circulation path 471 formed inside the frame 44 may be formed along the surface of the cooling plate 481.

The cooling plate 481 may be selected from a material with excellent thermal conductivity. For example, the cooling plate 481 may include a metal material such as copper.

Although the present disclosure has been described with reference to an embodiment shown in the drawings, these embodiments are an example only, and those skilled in the art will understand that various modifications and variations of the embodiments are possible therefrom. Therefore, the true technical protection scope of the present disclosure should be determined by the technical idea of the appended patent claims.

INDUSTRIAL APPLICABILITY

According to an embodiment of the present disclosure, a magnetron sputtering apparatus is provided. In addition, embodiments of the present disclosure may be applicable to sputtering apparatuses used in the industry, etc.

The invention claimed is:

1. A magnetron sputtering apparatus comprising:

a chamber accommodating sputter gas and providing an internal space in which a workpiece is arranged;

an ion source unit including a sputtering target providing a deposition material to the workpiece by an electric field formed in the internal space and a magnet arranged on one side of the sputtering target to form a magnetic field, and a frame on which the sputtering target and the magnet are provided;

a power supply unit providing power to the ion source unit; and a cooling unit including a cooling device provided outside the chamber and a cold head directly connecting the cooling device to the ion source unit in the internal space, wherein the cold head includes metal, wherein a core and a plurality of disks, having an inner circumferential surface in contact with an outer circumferential surface of the core and spaced apart in a direction in which the core extends, are inserted into the frame, and the cold head is in surface contact with the core exposed to one side surface of the frame.

2. The magnetron sputtering apparatus of claim 1, wherein the cold head is surrounded by a vacuum layer.

3. The magnetron sputtering apparatus of claim 1, wherein the cold head directly connects the ion source unit to the cooling device to maintain the magnet at −270 to 20° C. by using thermal conduction.

4. The magnetron sputtering apparatus of claim 1, wherein the cooling device is provided on the chamber by a connecting portion, the connecting portion includes a vibration-proof part and a coupling part formed at opposite ends of the vibration-proof part, and the vibration-proof part includes a metal bellows surrounding the cold head.

5. The magnetron sputtering apparatus of claim 1, wherein the cooling device is provided as a pulse tube refrigerator and is formed integrally with the chamber.

6. The magnetron sputtering apparatus of claim 1, wherein the magnet comprises a first magnet and a second magnet arranged with polarities with respect to the sputtering target.

7. The magnetron sputtering apparatus of claim 1, further comprising:

a control unit configured to control the cooling unit and the power supply unit; and a sensing unit capable of measuring temperature of the ion source unit.

8. A magnetron sputtering apparatus comprising:

a chamber accommodating sputter gas and providing an internal space in which a workpiece is arranged;

an ion source unit including a sputtering target providing a deposition material to the workpiece by an electric field formed in the internal space and a magnet arranged on one side of the sputtering target to form a magnetic field, and a frame on which the sputtering target and the magnet are provided;

a power supply unit providing power to the ion source unit; and a cooling unit including a cooling device provided outside the chamber and a cold head directly connecting the cooling device to the ion source unit in the internal space, wherein the cold head includes metal, wherein the frame includes a plurality of cores made of a thermally conductive material, the plurality of cores being spaced apart from each other and inserted in the form of male screws into one side surface of the frame, and the cold head is in surface contact with the plurality of cores exposed to the one side surface of the frame.

* * * * *